United States Patent [19]

Kim et al.

[11] Patent Number: 5,291,052
[45] Date of Patent: Mar. 1, 1994

[54] CMOS SEMICONDUCTOR DEVICE WITH (LDD) NMOS AND SINGLE DRAIN PMOS

[75] Inventors: Kyeong-tae Kim; Do-chan Choi, both of Seoul, Rep. of Korea

[73] Assignee: Samsung Electronics Co., Ltd.

[21] Appl. No.: 753,058

[22] Filed: Aug. 30, 1991

[30] Foreign Application Priority Data

Jul. 9, 1991 [KR] Rep. of Korea .................. 91-11609

[51] Int. Cl.$^5$ ................ H01L 29/94; H01L 31/062; H01L 31/113; H01L 27/088
[52] U.S. Cl. .................................... 257/369; 257/900; 257/408; 257/346
[58] Field of Search ............... 357/42, 43, 44, 23.3, 357/41; 257/369, 368, 346, 900, 408

[56] References Cited

U.S. PATENT DOCUMENTS

| | | | |
|---|---|---|---|
| 4,577,391 | 3/1986 | Hsia et al. | 357/23.9 |
| 4,661,833 | 4/1987 | Mizutani | 257/369 |
| 4,937,645 | 6/1990 | Ootsuka et al. | 357/42 |
| 5,021,354 | 6/1991 | Pfiester | 437/34 |
| 5,023,190 | 6/1991 | Lee et al. | 437/56 |
| 5,024,960 | 6/1991 | Haken | 357/42 |

FOREIGN PATENT DOCUMENTS

| | | |
|---|---|---|
| 244607 | 3/1987 | Fed. Rep. of Germany . |
| 401113 | 5/1990 | Fed. Rep. of Germany . |
| 4110645 | 2/1991 | Fed. Rep. of Germany . |

Primary Examiner—Rolf Hille
Assistant Examiner—Wael Fahmy
Attorney, Agent, or Firm—Cushman, Darby & Cushman

[57] ABSTRACT

A MOS semiconductor device and the methods for constructing the device. The MOS device provided with first and second MOS transistors are formed on two identical wafer sections. The impurity region of the first transistor and a first group of gate side wall spacers are aligned to the gate of the first transistor. The impurity region of the second transistor and a second group of gate side wall spacers are aligned to the gate of the second MOS transistor. The second group of gate side wall spacers have a thickness different from that of the first group of gate side wall spacers.

3 Claims, 5 Drawing Sheets

CMOS SEMICONDUCTOR DEVICE WITH (LDD) NMOS AND SINGLE DRAIN PMOS

BACKGROUND OF THE INVENTION

1. Field of the Invention

The present invention relates to a CMOS semiconductor device having a lightly doped drain (LDD) NMOS transistor and a single drain type PMOS transistor, and the methods for constructing the same.

2. Description of Related Art

The development of a fast MOS device has been usually accompanied by its miniaturization. With greater packing density of transistors, the field strength inside such devices also has increased. This causes several problems, such as a decrease in threshold voltage, punch-through, and "hot-carrier" effect. These problems degrade device characteristics.

Among all of the above problems, the hot carrier effect is especially detrimental to MOS device performance. The hot carrier effect is caused by an acceleration of a carrier inside a channel due to an intense field that is present across the depletion layer near the drain. A carrier which has gained sufficient energy may penetrate through the potential barrier between the silicon and the gate oxide film, entering the gate oxide film as a "hot carrier." The hot-carrier inside the oxide film may then become trapped and change the shape of the potential barrier at the interface between the silicon and the oxide film, consequently altering the threshold voltage and/or the mutual conductance.

An accelerated carrier inside the channel may generate new electron/hole pairs via an impact ionization. The newly generated carriers, in turn, may produce other electron/hole pairs via the same process. Thus, the impact ionization may propagate throughout the channel and produce an avalanche of hot carriers to be injected to the gate oxide film.

In addition, holes generated by the ionization increase the potential of the substrate by forming currents. The increase in the substrate potential may cause a break-down of parasitic bipolar transistors, and change the drain withstanding voltage.

The hot-carrier effect is more pronounced in NMOS transistors than in PMOS transistors, because a channel electron in NMOS can cause an impact ionization more readily than a channel hole in PMOS. In addition, the NMOS channel electron can move more easily into the NMOS oxide film than the PMOS channel hole into the PMOS oxide film. This is because the potential barrier between the silicon and the gate oxide film in NMOS is lower than that in PMOS.

Conventionally, LDD NMOS transistors have been used to relieve the hot-carrier effect. In an LDD NMOS transistor, lowering the impurity concentration near the drain reduces the field intensity and diminishes the hot-carrier effect. However, the low impurity concentration of the drain region adds a parasitic resistance between the drain and the channel. The parasitic resistance decreases the drain current.

If the impurity concentration near the drain region becomes too large, the substrate current also becomes large, amplifying the hot carrier effect. On the other hand, if the impurity concentration becomes too low, the drive current decreases because of a parasitic resistance. Thus, the impurity concentration is usually carefully selected to take account of both the hot carrier effect and the parasitic resistance.

One conventional CMOS design which addresses the above problems comprises the LDD NMOS transistors and the PMOS transistors of the single-drain type. In the design, the gate side wall spacers of NMOS and PMOS transistors are usually set to an equal thickness to simplify their manufacture.

$n^+$ source and drain regions of the LDD NMOS transistors are generally formed by As ion-implantation, because the diffusion rate of As is low and allows the formation a thin junction. On the other hand, the $p^+$ source and drain regions of PMOS transistors are generally formed by B ion-implantation.

Because B diffuses faster than As, the connection depth and side spreading of $p^+$ source and drain regions are larger than those of $n^+$ regions. Consequently, the effective channel length of the PMOS transistor is much shorter than that of the NMOS transistor. This implies that, if the size of NMOS channels were reduced, then the size of PMOS channels would be reduced even further. Such undesired reduction in PMOS channel size results in the distortion of PMOS structures. Thus, it is difficult to use the conventional technique to produce CMOS devices with very small LDD NMOS transistors.

SUMMARY OF THE INVENTION

It is an object of the present invention to provide a MOS semiconductor device in which the thickness of the gate side wall spacer of a first type of MOS transistor is different from that of a second type of MOS transistor, to allow further reduction of the first type of MOS transistor while preventing the distortion of the second type of MOS transistor structures.

It is another object of the present invention to provide methods which are most suitable for manufacturing such MOS semiconductor device.

In the present invention, the MOS semiconductor device is provided with the first and second type of MOS transistors, each on one of two identical wafer sections, in which a gate electrode and an impurity region of the first type of MOS transistor are aligned to a first gate side wall spacer, and in which an impurity region of the second type of MOS transistor is aligned to a second gate side wall spacer having the thickness different from that of the first gate side wall spacer.

The present invention also provides the methods for manufacturing the above MOS semiconductor device. One method generally comprises the steps of:

concurrently forming gate electrodes of MOS transistors;

forming side wall spacers on the side walls of the electrodes;

forming impurity regions for one type of MOS transistors;

forming additional side wall spacers about some of the side wall spacers created earlier; and forming impurity regions for the other type of MOS transistors.

The other method comprises the general steps of:

concurrently forming gate electrodes of the MOS transistors;

forming side wall spacers on the side walls of the electrodes of one type of MOS transistors;

forming impurity regions for the MOS transistors whose gates have the side wall spacers;

forming side wall spacers on the side walls of the gate electrodes of the other type of MOS transistors, the side wall spacers of the other type of MOS transistors being thicker than the side walls formed in the previous steps; and forming impurity regions for the other type of MOS transistors.

BRIEF DESCRIPTION OF THE DRAWINGS

The above and other objects and advantages of this invention will become more apparent and more readily appreciated from the following detailed description of the presently preferred exemplary embodiment of the invention, taken in conjunction with the accompanying drawings, of which.

DETAILED DESCRIPTION OF THE PRESENTLY PREFERRED EXEMPLARY EMBODIMENTS OF THE PRESENT INVENTION

Figure 1:
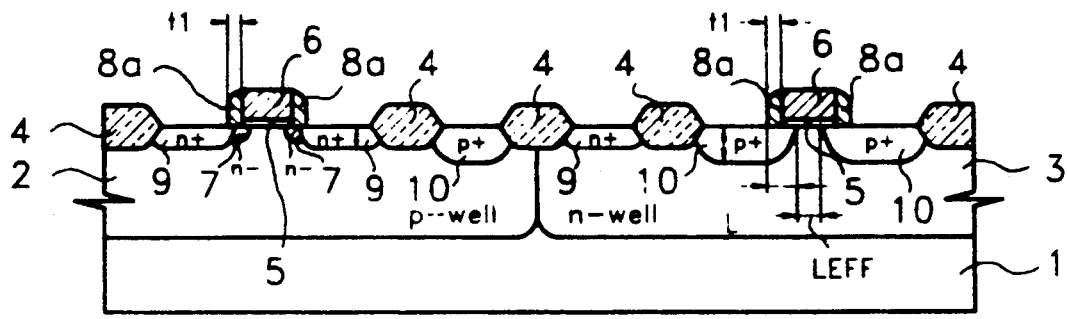
FIG. 1 is a diagrammatic cross-sectional view of the structure of a conventional LDD CMOS semiconductor device.

FIG. 1 shows a conventional CMOS semiconductor device, with p-well 2 and n-well 3 formed within a silicon substrate 1. The figure also shows an NMOS transistor constructed in p-well 2 and a PMOS transistor in n-well 3.

The NMOS transistor has gate electrode 6 comprising gate oxide film 5 at the center of substrate 1 of an active region defined by field oxide film 4 of p-well 2 and n$^-$ impurity region 7. An LDD structure includes n$^-$ impurity region 7 and n$^+$ impurity region 9 both of that are self-aligned, respectively, to gate electrode 6 and side wall spacer 8.

The PMOS transistor has gate electrode 6 comprising gate oxide film 5 at the center of substrate 1 of the active region defined by field oxide film 4 of n-well 3, and p$^+$ impurity region 10 that is self-aligned to side wall spacer 8 of gate electrode 6.

It is noted that one of p$^+$ impurity regions 10 is formed in the area defined by field oxide film 4 of p-well 2. Also, one of n$^+$ impurity regions 9 is formed near the well contact region defined by field oxide film 4 of n-well 3.

After gate electrode 6 has been constructed, gate side wall spacers 8 of the NMOS and PMOS transistors are produced by depositing a thermal oxide film on the surface of substrate 1 and anisotropically etching the deposited film. This process leaves the thermal oxide film only on the side walls of gate electrodes 6. In this process, the thicknesses of gate side wall spacers 8 of the PMOS and LDD NMOS transistors are identical. It is noted that gate side wall spacers 8 of an LDD NMOS transistor are thinly formed to minimize the length of n$^-$ impurity region 9.

After gate side wall spacers 8a have been constructed, p$^+$ impurity region 10 of the PMOS transistor is formed by implanting a p$^+$ impurity, for example, such as BF$_2$ ions (40keV at density of $5 \times 10^{15}$/cm$^2$) and activating the implanted impurity through a 60-minute thermal process at 900i$_F$.

When B$^+$ or BF$_2$ ions are used as the p$^+$ impurity, because the diffusion rate of B$^+$ is greater than that of As (an n$^+$ impurity), the connection depth (4000 Å) and side spreading (3000 Å) of p$^+$ impurity region 10 become larger than the connection depth (1500 Å) and side spreading of n$^+$ impurity region 9. The expansion of p$^+$ impurity region 10 pinches off and shortens its channel to a greater extent than that of n$^+$ impurity region 10.

For example, if the thickness of the gate side wall spacer 8 were 1000 Å, the effective channel length Leff of the PMOS transistor would be smaller than the desired length L by approximately 4000 Å. Compared to the case when the gate side wall spacer is approximately 2000 Å, the effective channel length would be shorter by 2000 Å.

It is difficult to avoid the above problem, because, if the thickness of gate side wall spacers 8 of the PMOS transistor were increased to about 2000 Å, the thickness of gate side wall spacer 8 of the NMOS transistor would also become large. Consequently, the length of n$^-$ impurity region 7 would become longer and allow hot carriers to degrade the performance of the NMOS transistor.

In summary, conventional CMOS designs and its manufacturing process does not permit an easy optimization of the device characteristics of both PMOS and NMOS transistors, because of different diffusion rates of n-type and p-type impurities.

Figure 2:
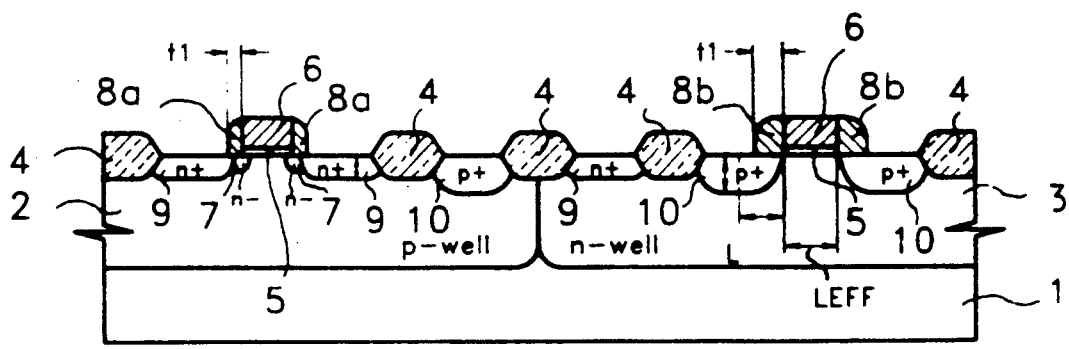
FIG. 2 is a diagrammatic cross-sectional view of the structure of an LDD CMOS semiconductor device according to the present invention.

FIG. 2 shows a CMOS device according to the present invention. In FIG. 2, the parts and regions corresponding to those in FIG. 1 have been labelled with the same numerals. A detailed description of such parts is omitted.

Whereas FIG. 1 illustrates identical gate side wall thicknesses for both the PMOS and NMOS transistors, FIG. 2 shows the thickness t$_2$ of gate side wall spacer 8b of the PMOS transistor as being greater than the thickness t$_1$ of gate side wall spacer 8a of the NMOS transistor. That is, in the present invention, gate side wall spacer 8a of the NMOS transistor is designed to have a thickness different from that of gate side wall spacer 8b of the PMOS transistor, to compensate for different connection depths and side spreadings of the n-type impurity region and the p-type impurity region.

FIGS. 3A–3G illustrates cross-sectional structural diagrams of a semiconductor device at various stages in the method for constructing a structure generally in accordance with FIG. 2.

Figure 3A:
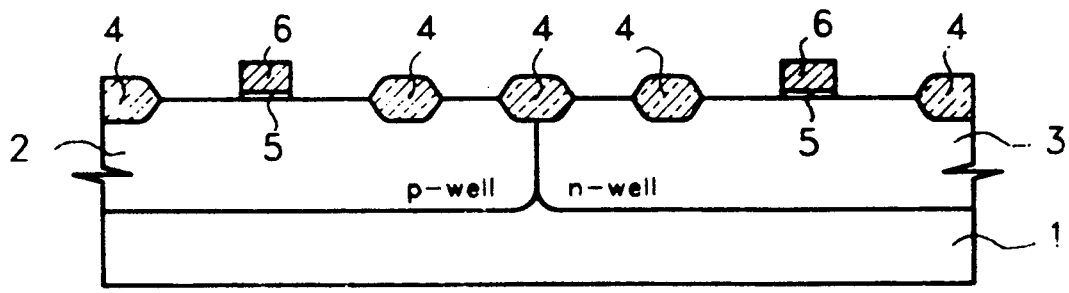
FIGS. 3A–3G show diagrammatic cross-sectional views of the LDD CMOS semiconductor device at various stages in a manufacturing process according to an embodiment of the present invention.

As illustrated in FIG. 3A, the method for producing the above-described structure of FIG. 2 begins with the formation of p-well 2 and n-well 3, each well having the depth of 2 to 7 μm. Each well has a maximum impurity concentration of $1 \times 10^{16}$ to $1 \times 10^{17}$ ions/cm$^3$. Both wells are formed by the conventional twin-well fabrication process.

Next, field oxide film 4 is blanketed on substrate 1 via the conventional LOCOS process to define the active regions of p- and n-wells 2, 3. Subsequently, thin oxide film 5 of 50 Å to 200 Å is layered on substrate 1 by the thermal oxidation method. Next, polycrystalline silicon 6 doped with impurities is deposited on the surface of the structure resulting from the previous step. Polycrystalline silicon 6 and oxide film 5 are then patterned via conventional photolithography to produce gate oxide film 5 and gate electrode 6 in the active regions.

It is noted that gate electrode 6 may be constructed from a refractory-metal polycide. Also, a silicon substrate doped with n-type or p-type impurities may be used as an n-well or a p-well. The concentration of the impurities may be controlled to set the desired threshold voltage of the transistors either before or after the layering of gate oxide film 6.

Figure 3B:
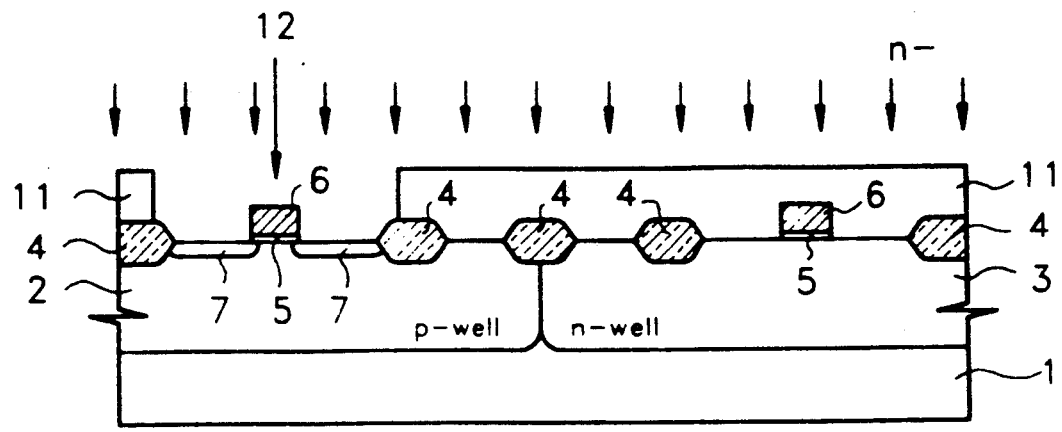

FIG. 3B illustrates the structure of the semiconductor device after a few of the subsequent steps. First, photoresist 11 is coated on substrate 1. Next, opening 12 is formed on photoresist 11. The location of opening 12 corresponds to the active region of p-well 2. n− impurity region 7, which is self-aligned to gate electrode 6, is formed near the surface of substrate 1 by first implanting an n-type impurity, such as P or As, through opening 12 into substrate 1 of p-well 2, at density of $1 \times 10^{13}$ to $1 \times 10^{14}$ ions/cm$^2$ and at 30 KeV to 60 KeV, and then activating the implanted ions.

Figure 3C:
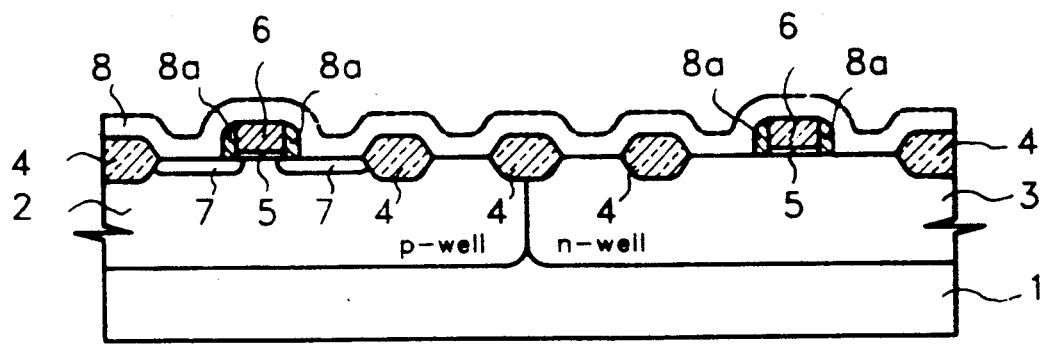

FIG. 3C illustrates gate side wall spacer 8a. Gate side wall spacer 8a is produced by first removing photoresist 11, then layering insulating film (such as CVD oxide and high temperature oxide film) uniformly on substrate 1, and anisotropically etching the film. The film may be 500 Å to 2000 Å thick.

Figure 3D:
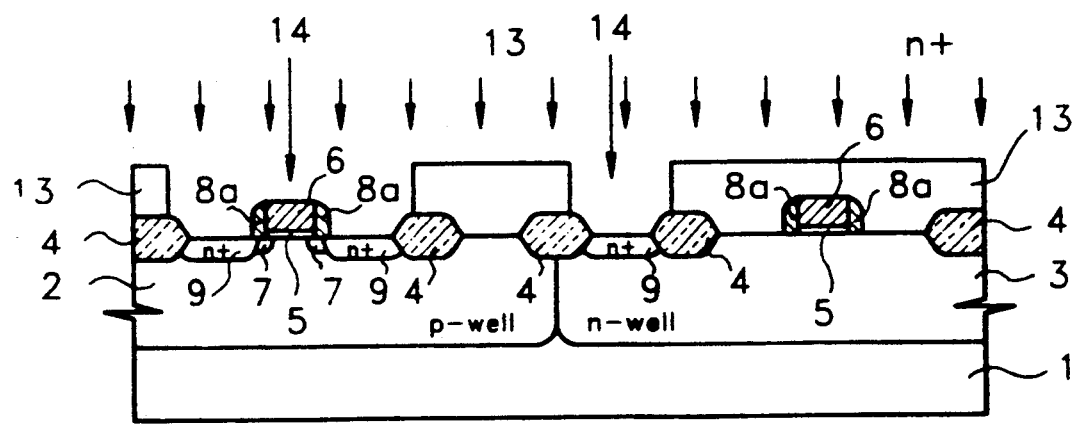

Next, photoresist 13 is coated on the structure resulting from the previous step (FIG. 3D). Openings 14 are formed in photoresist 13 over the areas which correspond to the active region of p-well 2 and the well contact region of n-well 3. Next, n+ impurity region 9 is formed near the exposed surface of substrate 1 by implanting an n type impurity such As or P through opening 14 at a density of $1 \times 10^{15}$ to $1 \times 10^{16}$ ions/cm$^2$ and at 10 keV to 50 keV, then activating the implanted impurity ions.

Figure 3E:
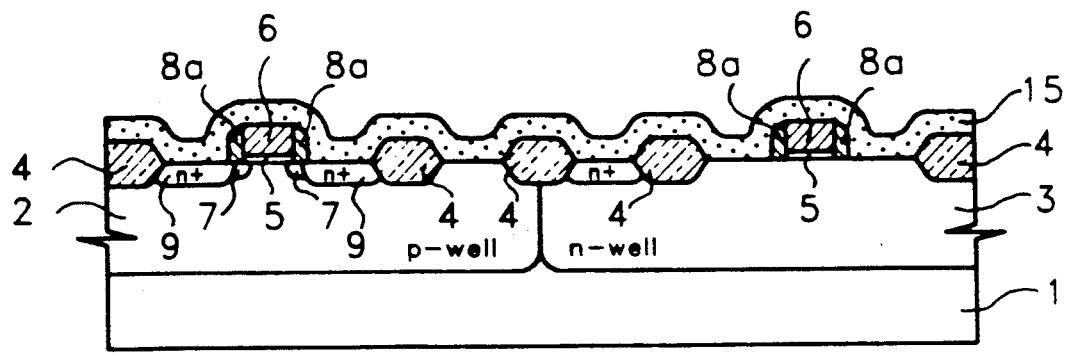

FIG. 3E shows insulating film 15 that is uniformly deposited on substrate 1 (approximately 500 Å to 2000 Å thick).

Figure 3F:
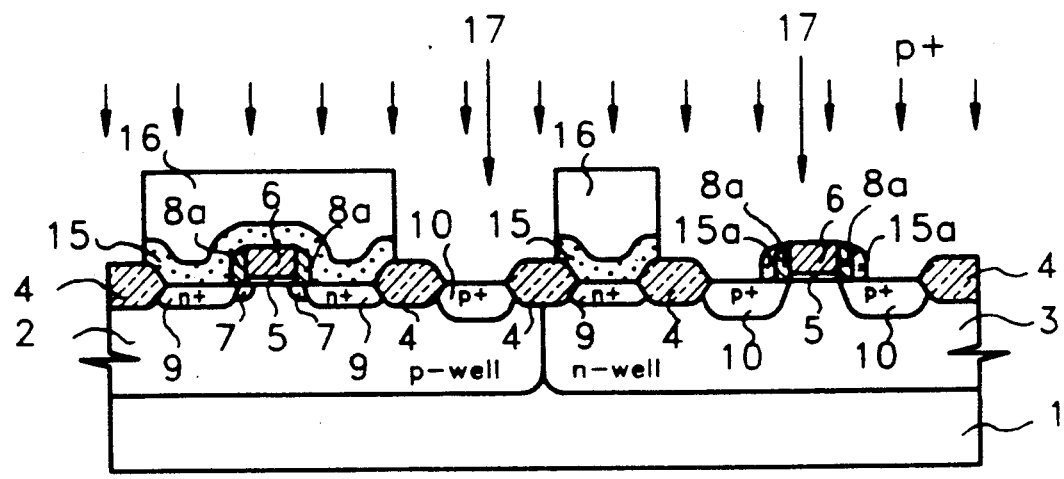

Next, as partially shown in FIG. 3F, photoresist 16 is coated on insulating film and openings 17 are formed in photoresist 16 over the areas corresponding to the active region of n-well 3 and a well contact region of p-well 2. Next, second gate side wall spacer 15a is formed on first gate side wall spacer 8a of n-well 3 by anisotropically etching insulating film 15. p+ impurity region 10 is formed near the exposed surface of substrate 1 by implanting a p+ impurity such as B or BF$_2$ through openings 17 at a density of $1 \times 10^{15}$ to $1 \times 10^{16}$ ions/cm$^2$ and at 10 keV to 50 keV, then activating the implanted impurity.

Spacer 8a and spacer 15a together form spacer 8b, each of which is thicker than each of spacers 8 of the NMOS transistor. Spacers 8b and gate 6 between spacers 8b cover larger surface areas than spacers 8a and gate 6 between spacers 8a.

The activation of p+ impurity causes the two p+ regions to spread and pinch the channel between the regions. However, because the p+ regions are further apart (because of spacers 8b), the spreading of the p+ regions creates a channel region whose length is approximately equal of that of the channel between spacers 8a, despite the greater diffusion rate of the p+ impurity. Thus, in the present method, the channel length of PMOS is not undesirably shortened, as in the conventional manufacturing method for producing LDD NMOS transistors.

Figure 3G:
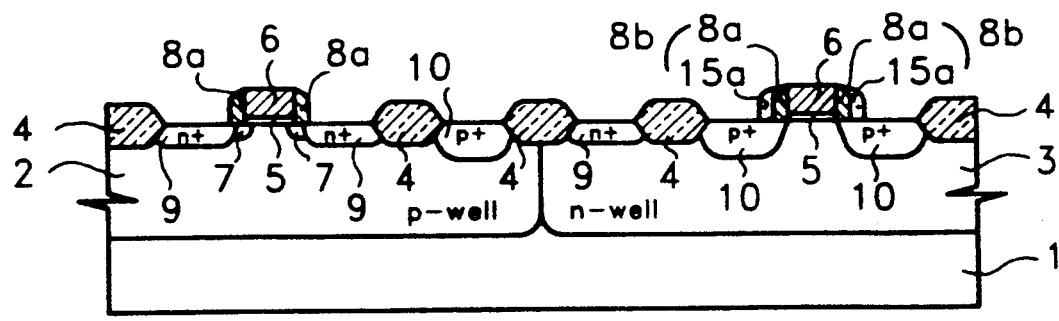

To complete the CMOS fabrication process, photoresist 16 is removed, so that an NMOS transistor having first gate side wall spacer 8a in p-well 2 and a PMOS transistor having first and second gate side wall spacers 8a and 15a as side wall spacers 8b are formed as shown in FIG. 3G.

FIGS. 4A-4F show the structures of the LDD CMOS device at various stages in another method for manufacturing the CMOS device according to the present invention. The parts corresponding to the parts in FIGS. 3A-3G have been labelled with the same numerals.

Figure 4A:
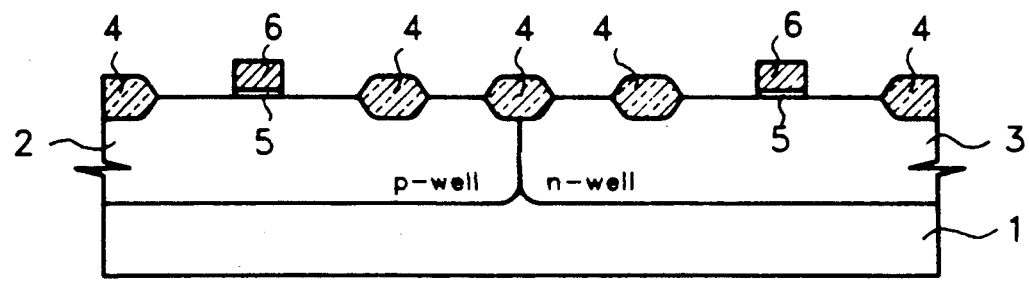
FIGS. 4A–4F show diagrammatic cross-sectional views of the LDD CMOS semiconductor device at various stages in a manufacturing process according to another embodiment of the present invention.
Figure 4B:
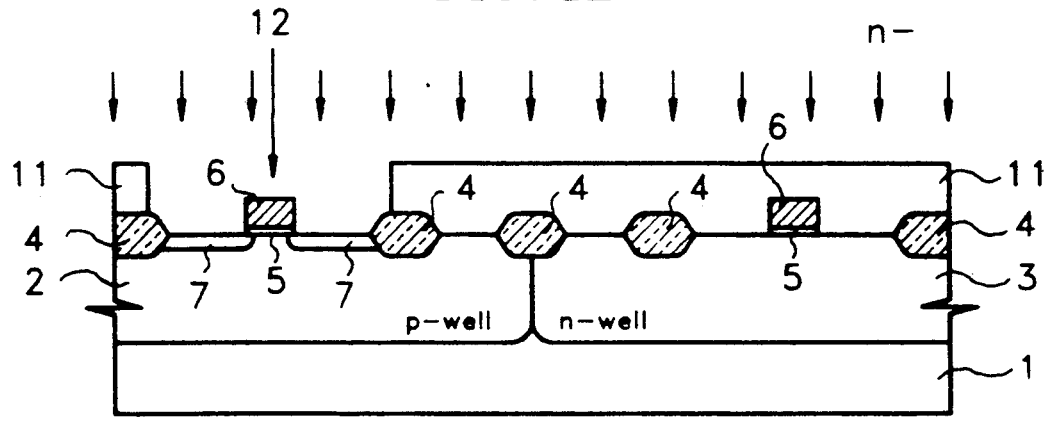

FIGS. 4A and 4B are identical to FIGS. 3A and 3B and the steps related to FIGS. 4A and 4B are omitted.

Figure 4C:
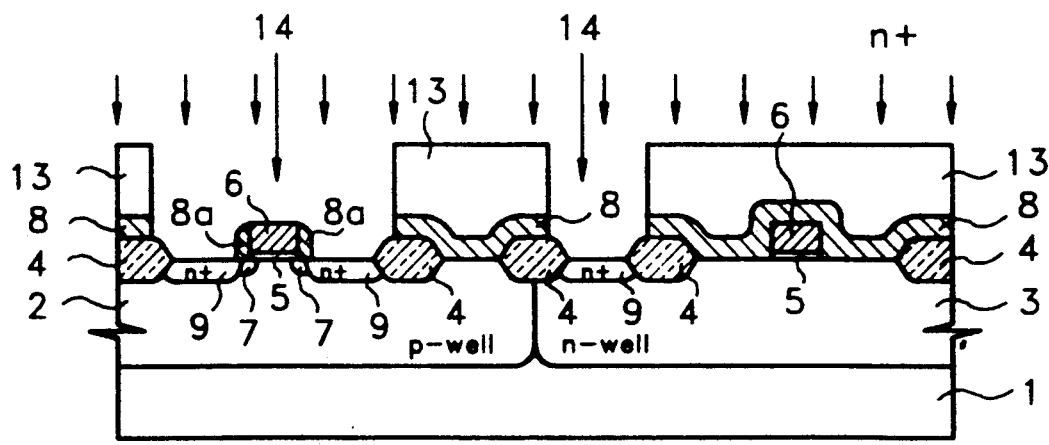

As shown in FIG. 4C, after the structure in FIG. 4B has been derived, photoresist 11 is removed. Next, insulating film 8 is deposited, and photoresist 13 is coated on the surface of film 8. Next opening 14 is formed. First gate side wall spacers 8a are constructed only on the side walls of gate electrode 6 of p-well 2 by anisotropically etching insulating film 8 through opening 14. After first gate side wall spacers 8a have been formed, n+ impurity region 9 is formed by implanting n+ impurity ions through opening 14 and then activating the implanted impurity.

Figure 4D:
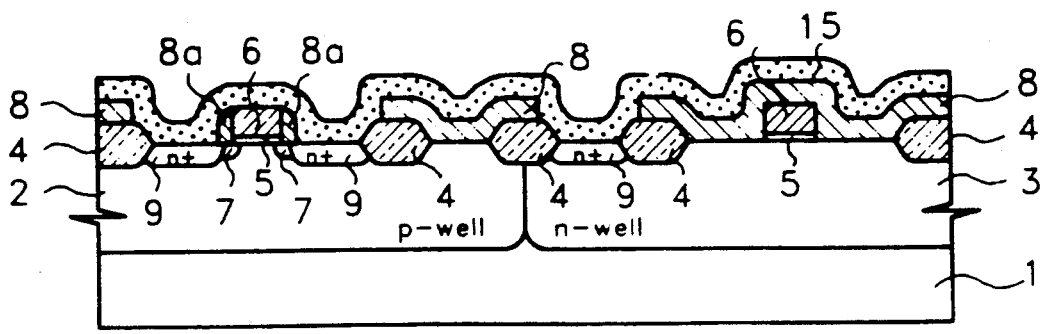

Subsequently, photoresist 13 is removed and second insulating film 15 is deposited, as shown in FIG. 4D.

Figure 4E:
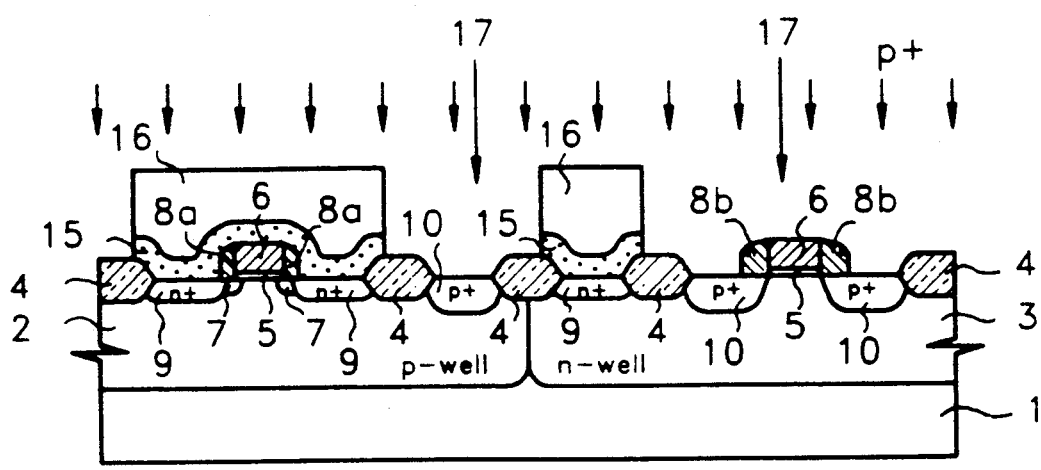

FIG. 4E illustrates the structure of the CMOS device after the application of additional steps. First, photoresist 16 is coated on second insulating film 15 and openings 17 are formed on film 15. Next, second gate side wall spacer 8b is formed on the side walls of gate electrode 6 of n-well 3 by anisotropically etching second insulating film 15 and first insulating film 8 through opening 17. It is noted that second gate side wall spacer 8b is constructed to be thicker than first gate side wall spacer 8a. p+ impurity region 10 is formed by implanting p+ impurity ions and then activating the implanted impurity.

Figure 4F:
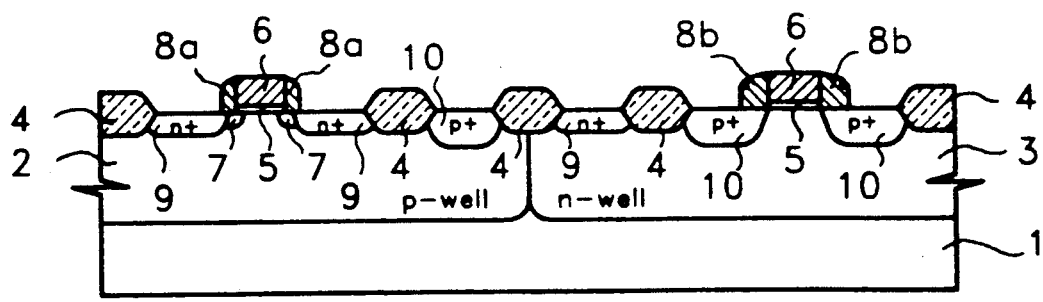

Finally, the CMOS semiconductor device having different thicknesses of gate side wall spacers, as shown in FIG. 4F, is obtained by removing photoresist 16, after second gate side wall spacers 8b have been formed.

In the present invention, gate side wall spacers 8a and 8b of PMOS and NMOS have different thicknesses. As explained above, such structures take into consideration the different diffusion rates of n+ impurity and p+ impurity. The present invention allows further reduction of NMOS and PMOS transistors without distorting PMOS transistor structures. It is noted, in constructing the side wall spacers of the instant invention, their thickness must be correlated with the diffusion rate of B and As. Since B spreads faster than As, the side wall spacers must be thick enough to compensate for the greater spreading of B.

Although only a few embodiments of this invention has been described in detail above, those skilled in the art will readily appreciate that many modifications are possible in the preferred embodiment without materially departing from the novel teachings and advantages of this invention. For example, the present invention not only applies to CMOS devices, but also to devices in which the thicknesses of "gate side wall spacers" need to be varied. Accordingly all such modifications are intended to be included within the scope of this invention as defined by the following claims.

What is claimed is:

1. A MOS semiconductor device having groups of transistors, each group comprising:
   an NMOS transistor on a first silicon wafer section including
   a first gate electrode,
   a first group of side wall spacers, each spacer of said first group of side wall spacers being adjacent to a side wall of said first gate electrode, and
   a first impurity region self-aligned to each side wall spacer of said first group of said side wall spacers; and
   a PMOS transistor on a second silicon wafer section including
   a second gate electrode,
   a second group of side wall spacers, each of the second group of side wall spacers being adjacent to a side wall of said second gate electrode, said second group of side wall spacers having a thickness greater than that of said first group of side wall spacers, and
   a second impurity region self-aligned to each of said second group of side wall spacers.

2. A MOS semiconductor device as claimed in claim 1, wherein the difference between the thickness of said second group of side wall spacers and said first group of side wall spacers is proportional to the difference between a diffusion rate of an impurity in said first impurity region and a diffusion rate of another impurity in said second impurity region.

3. A MOS semiconductor device as in claim 1, said NMOS transistor further including a third impurity region self-aligned to said first gate electrode, said third impurity region having an impurity concentration lower than that of said first impurity region.

* * * * *